(12) United States Patent
Lee

(10) Patent No.: US 7,449,387 B2
(45) Date of Patent: Nov. 11, 2008

(54) MOS TRANSISTOR AND METHOD OF MANUFACTURING THE SAME

(75) Inventor: Yong Guen Lee, Chungcheongbuk-do (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 373 days.

(21) Appl. No.: 11/319,595

(22) Filed: Dec. 29, 2005

(65) Prior Publication Data

US 2006/0145253 A1    Jul. 6, 2006

(30) Foreign Application Priority Data

Dec. 30, 2004   (KR) ..................... 10-2004-0117515

(51) Int. Cl.
*H01L 21/336* (2006.01)
(52) U.S. Cl. .................. 438/303; 438/283; 438/301
(58) Field of Classification Search ................. 438/303, 438/283, 301, 304
See application file for complete search history.

(56) References Cited

U.S. PATENT DOCUMENTS

| | | | | |
|---|---|---|---|---|
| 5,953,616 A | * | 9/1999 | Ahn | 438/305 |
| 6,197,648 B1 | * | 3/2001 | Kasai et al. | 438/305 |
| 6,586,306 B2 | * | 7/2003 | Lee et al. | 438/305 |
| 6,939,770 B1 | * | 9/2005 | Khan et al. | 438/301 |
| 2002/0155686 A1 | * | 10/2002 | Lin et al. | 438/527 |
| 2004/0121531 A1 | * | 6/2004 | Wieczorek et al. | 438/197 |

FOREIGN PATENT DOCUMENTS

KR    1020040050116    *  6/2004

* cited by examiner

*Primary Examiner*—Phuc T Dang
(74) *Attorney, Agent, or Firm*—McKenna Long & Aldridge LLP

(57) ABSTRACT

A manufacturing method of a double LDD MOS transistor includes forming a gate electrode on a semiconductor substrate; forming a first LDD area by implanting and thermally annealing impurity ions using the gate electrode as a mask; forming a first spacer on both lateral walls of the gate electrode; forming a second LDD area by implanting and thermally annealing impurity ions using the gate electrode and the first spacer as a mask; forming a second spacer on both lateral walls of the gate electrode and the first spacer; and forming a source-drain diffusion area by implanting and thermally annealing impurity ions using the gate electrode, the first spacer, and the second spacer as a mask.

6 Claims, 8 Drawing Sheets

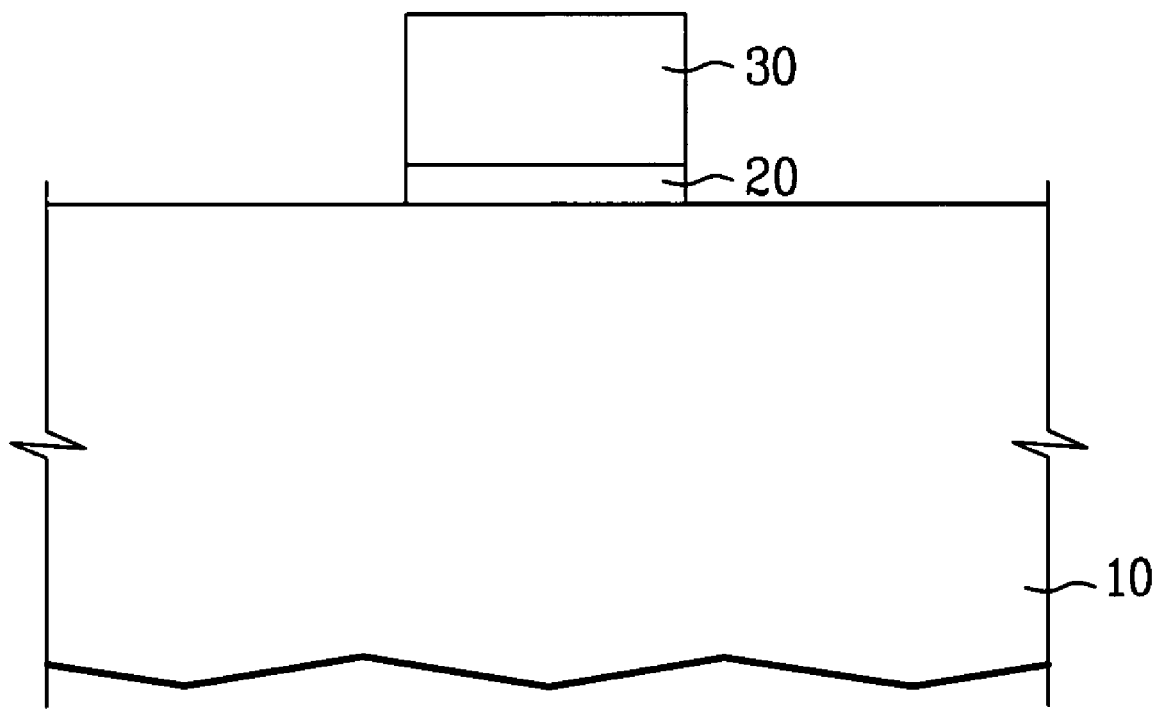

MOS TRANSISTOR AND METHOD OF MANUFACTURING THE SAME

CROSS-REFERENCE TO RELATED APPLICATION

This application claims the benefit of Korean Patent Application No. 2004-0117515, filed on Dec. 30, 2004, which is hereby incorporated by reference for all purposes as if fully set forth herein.

BACKGROUND OF THE INVENTION

1. Field of the Invention

The present invention relates to a manufacturing technique for a MOS transistor semiconductor device, and more particularly, to a MOS transistor having a double LDD structure and a manufacturing method thereof.

2. Discussion of the Related Art

In the early days of semiconductor integrated circuits, a silicon die having a size of 1-2 mm was generally required for each transistor. Currently however, millions of unit elements can be integrated on a silicon die having a size of 20 mm×20 mm. The size of a unit transistor should be minimized in order to manufacture such integrated circuit, and to this end, various processing techniques are being developed.

As the unit transistor of an integrated circuit has been scaled down, a substrate having a source-drain diffusion area that is deeply diffused and a highly thin junction having a large curvature is utilized. In a drain-substrate junction, in which impurities have a sharp concentration gradient, impact ionization may occur due to a hot carrier. To address this issue, a lightly doped drain (LDD) structure has been utilized. The LDD is structured such that a boundary of a polysilicon gate is first determined, and an LDD extension line determining a channel extension is subsequently formed using an N-type impurity implantation.

Meanwhile, after a gate electrode and a source-drain diffusion area of a transistor are formed, a contact with metal wiring is formed so that the gate electrode and the source-drain diffusion area can be electrically connected. At this time, a thin polysilicon gate and a shallow source-drain diffusion area are formed due to the scaling down of a transistor, such that both of resistances thereof cannot be reduced to be less than 10-20 ohms/square. For this reason, the efficiency of an interconnection material is significantly decreased.

To address this issue and improve interconnection, a method of forming a silicide having a low resistivity on a silicon of a gate or a source-drain area has been utilized. Particularly, a process for forming a silicide on the gate and the source-drain area of a transistor concurrently is called a salicide process. Through the salicide process, a parasitic transistor can be removed, which may occur when the source-drain and the gate overlap, and since the contact space of a metal and the source-drain increases, the contact resistance and inner resistance of the source-drain can be reduced.

FIGS. 1A-E illustrate a conventional method of forming an LDD and a salicide of a semiconductor device.

First, a gate oxide 20 and a polysilicon 30 are sequentially formed on a substrate 10 in an active area for forming a transistor, and subsequently, a patterning is performed only in an area for forming a gate electrode thereon by photolithography and etching processes, as shown in FIG. 1A.

Next, impurity ions having an opposite conductive type with respect to the substrate 10 are implanted with a low concentration and a low energy using the poly silicon gate 30 as a mask, which is formed as shown in FIG. 1A, and is thermally annealed to form an LDD area 22*a* as shown in see FIG. 1B.

After the LDD area 22*a* is formed, an oxide layer is formed on the whole surface of the substrate 10 using a low pressure chemical vapor deposition (LPCVD), and the oxide layer is then etched and removed except for an oxide layer on lateral walls of the gate 30. The oxide layer remaining on the lateral walls of the gate 30 is a spacer 32 that prevents a short between a gate and a source-drain diffusion area that may occur in an after-mentioned salicide process. The spacer 32 is formed as shown in FIG. 1C.

Next, as shown in FIG. 1D, impurity ions are implanted and thermally annealed using the poly silicon gate 30 and the spacer 3 as a mask to form a source-drain diffusion area 22*b* with a high concentration. Next, a metal such as cobalt (Co) or titanium (Ti), which forms a salicide in reaction with silicon or polysilicon, is deposited on the whole surface of the substrate 10. Next, a salicide layer is formed on a polysilicon gate and on a silicon substrate of the source-drain diffusion area in an annealing process, and subsequently, any metal that has not been reacted is removed by selective etching. A self aligned silicide formed in this way is referred to a salicide. FIG. 1E shows salicide layers 24*a* and 24*b* which are respectively formed on the polysilicon gate 30 and the source-drain diffusion area.

However, the aforementioned manufacturing method of a semiconductor device has at least following problems.

First, as a circuit is highly integrated, unit transistor elements become closer to one another. At this time, as gate electrodes of transistors are disposed adjacent to one another, the distance between the gates becomes very small. Thus, an exposure area of a source-drain diffusion area between the gates having the oxide spacer 32 becomes small. As shown in FIG. 2, a salicide forming area becomes very narrow in the source-drain diffusion area. As a result, free space for forming a contact becomes narrow, and the salicide does not form well and surface resistance increases.

Second, in order to prevent a lateral diffusion of impurities when the LDD is formed, a junction has to be shallowly formed. However, due to the scaled down transistor element, if a gate width is narrowly designed, a short channel effect becomes serious. Namely, as the width of the gate decreases, the depth of the LDD area and the concentration of the impurities become difficult to control, and as such, the lateral diffusion of the impurities towards the gate is difficult to control. Therefore, the gate and the drain overlap in an area, and if the overlapping area increases, resistance and parasitic capacitance increase.

SUMMARY OF THE INVENTION

Accordingly, the present invention substantially obviates one or more disclosed or undisclosed problems or issues that may be due to limitations and disadvantages of the related art.

The present invention provides a double LDD transistor which has a double LDD structure in which a lateral diffusion of impurities towards a lower portion of a gate can be effectively prevented when an LDD is formed in implementing a MOS transistor.

The present invention also provides a manufacturing method of a double LDD transistor in which the width of a gate can be ensured to a maximum design limit by removing a second spacer and an area for forming a salicide in the gate and a source-drain area can be increased.

According to an exemplary embodiment of the present invention, a manufacturing method of a double LDD MOS transistor comprises steps of forming a gate electrode on a semiconductor substrate; forming a first LDD area by implanting and thermally annealing impurity ions using the gate electrode as a mask; forming a first spacer on both lateral walls of the gate electrode; forming a second LDD area by implanting and thermally annealing impurity ions using the gate electrode and the first spacer as a mask; forming a second spacer on both lateral walls of the gate electrode and the first spacer; and forming a source-drain diffusion area by implanting and thermally annealing impurity ions using the gate electrode, the first spacer, and the second spacer as a mask.

The first spacer may be formed with a silicon oxide, and the second spacer may be formed with a nitride oxide.

In addition, the manufacturing method of a double LDD MOS transistor according to an exemplary embodiment of the present invention may further comprise the steps of removing the second spacer by selective etching after the source-drain diffusion area is formed, and forming salicide layers on the gate electrode and the source-drain diffusion area, respectively, by forming and annealing a salicide forming metal on the semiconductor substrate.

A transistor element of an exemplary embodiment of the present invention can be manufactured by the aforementioned manufacturing method of a double LDD MOS transistor.

BRIEF DESCRIPTION OF THE DRAWINGS

The accompanying drawings, which are included to provide a further understanding of the invention illustrate embodiments of the invention, and together with the description, serve to explain the invention. In the drawings.

DETAILED DESCRIPTION OF THE PREFERRED EMBODIMENTS

Reference will now be made in detail to at least one embodiment of the present invention, examples of which are illustrated in the accompanying drawings. Wherever possible, like reference designations will be used throughout the drawings to refer to the same or similar parts.

Referring to FIGS. 3A-3G, in an active area for forming a transistor, a gate oxide 20 and a polysilicon 30 are sequentially formed on a substrate 10, and then a gate electrode is formed in photography and etching processes.

Figure 3A:
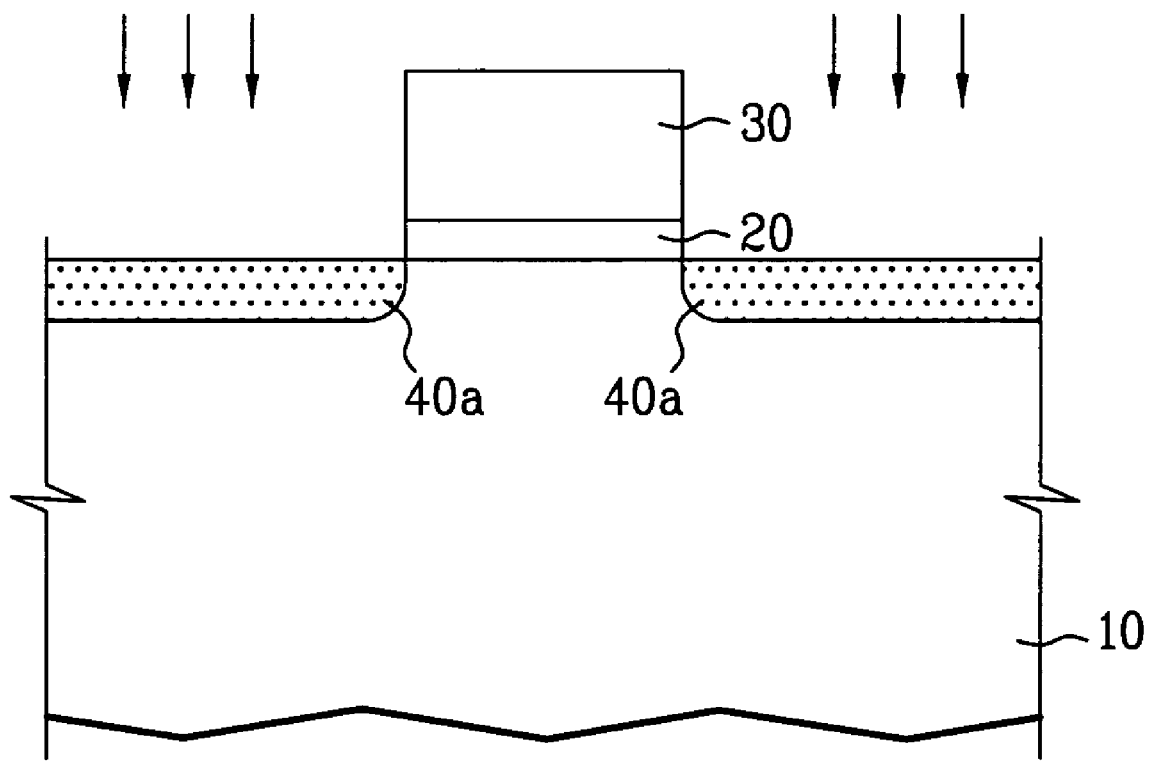
FIG. 3 is a view illustrating a double LDD MOS transistor according to one embodiment of the present invention.
Figure 3B:
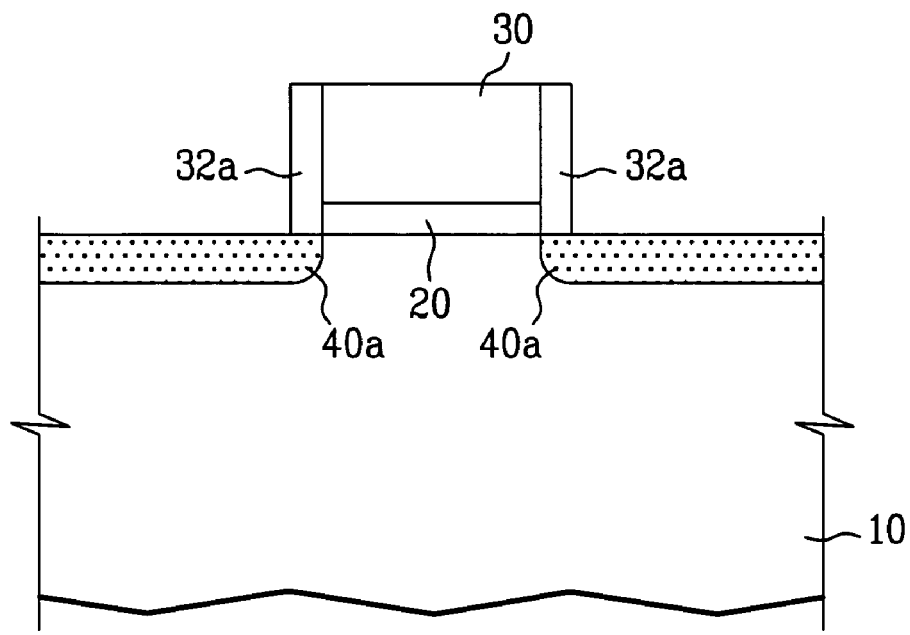

Next, impurity ions having an opposite conductive type with respect to the substrate 10 are implanted with a low concentration and a low energy and are thermally annealed using the polysilicon gate 30 as a mask to form a first LDD area 40a as shown in FIG. 3A. Both of the ion implantation and the thermal annealing processes for forming the first LDD area 40a are included in a first LDD implant process. The first LDD implant process forms an overlap of a gate area by implanting the impurity with a low concentration.

After the first LDD area 40a is formed, an oxide layer is formed on a whole surface of the substrate 10 using a low pressure chemical vapor deposition (LPCVD), and the oxide layer is then etched and removed except for an oxide layer on lateral walls of the gate 30. The oxide layer remaining on the lateral walls of the gate 30 is a first spacer 32a which prevents a short between a gate and a source-drain diffusion area in the salicide process described below. The first spacer 32a can be formed with a silicon oxide and has a minimum thickness in order to prevent the short between the gate and the source-drain diffusion area. The first spacer 32a can be seen in FIG. 3B.

Figure 1B:
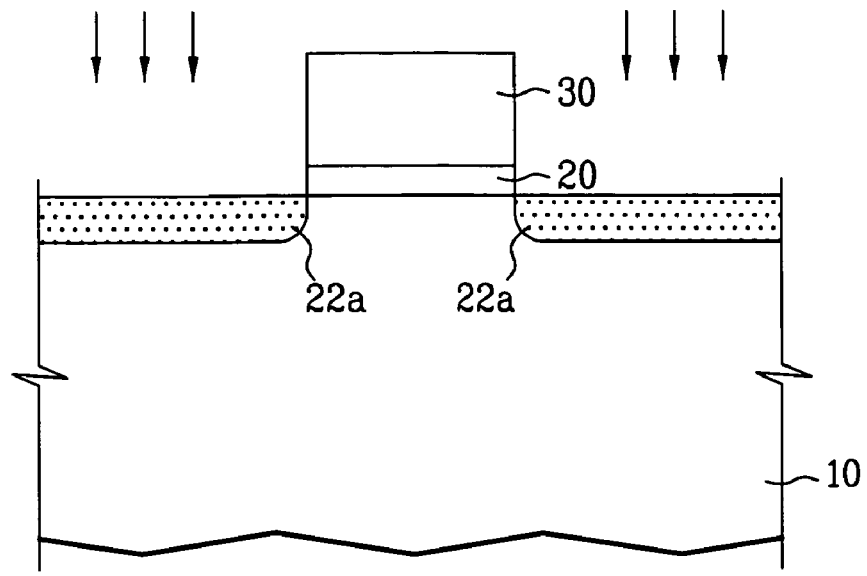
FIG. 1 is a view illustrating a conventional manufacturing method of a MOS transistor having a spacer and an LDD structure.
Figure 1C:
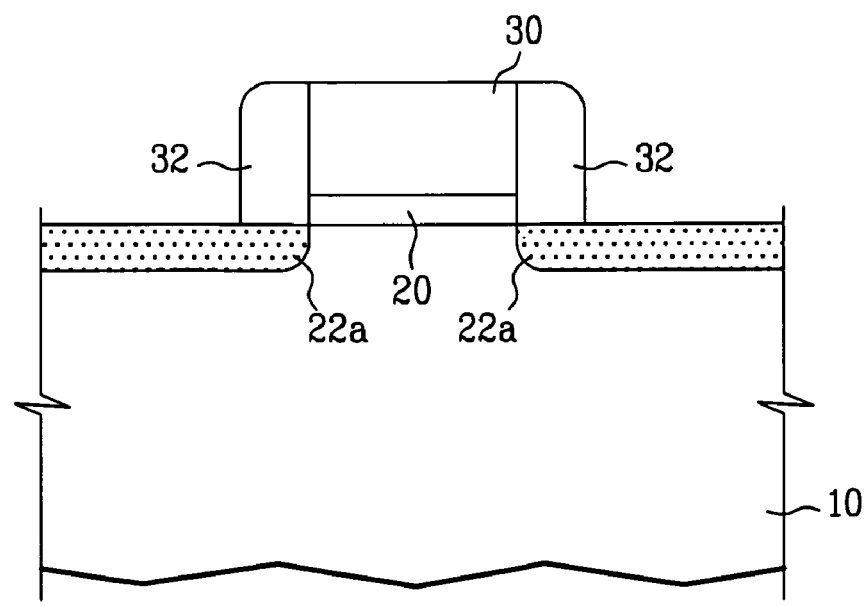
Figure 1D:
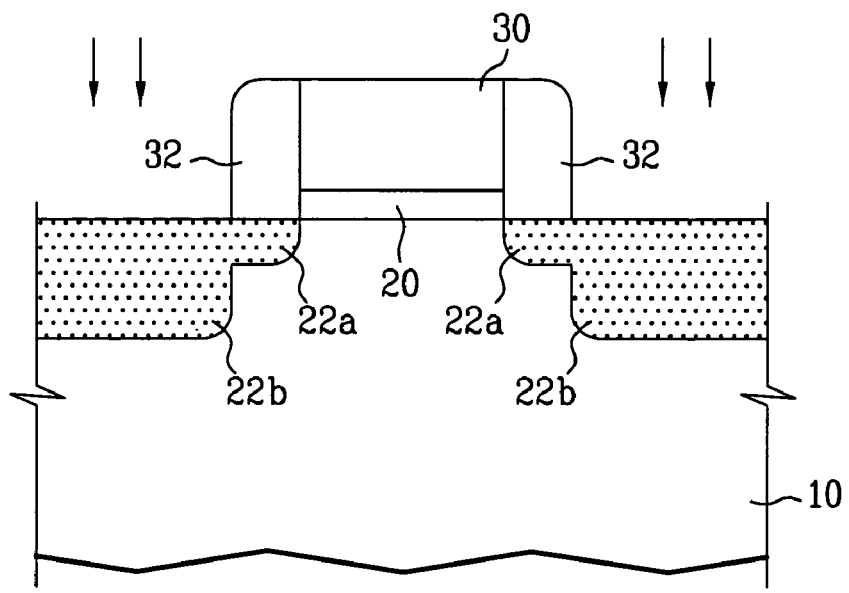
Figure 1E:
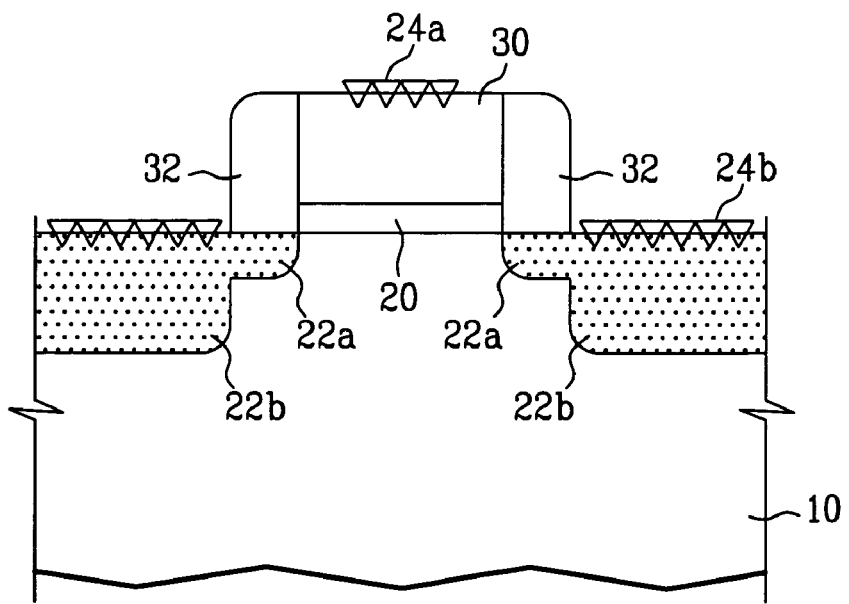
Figure 2:
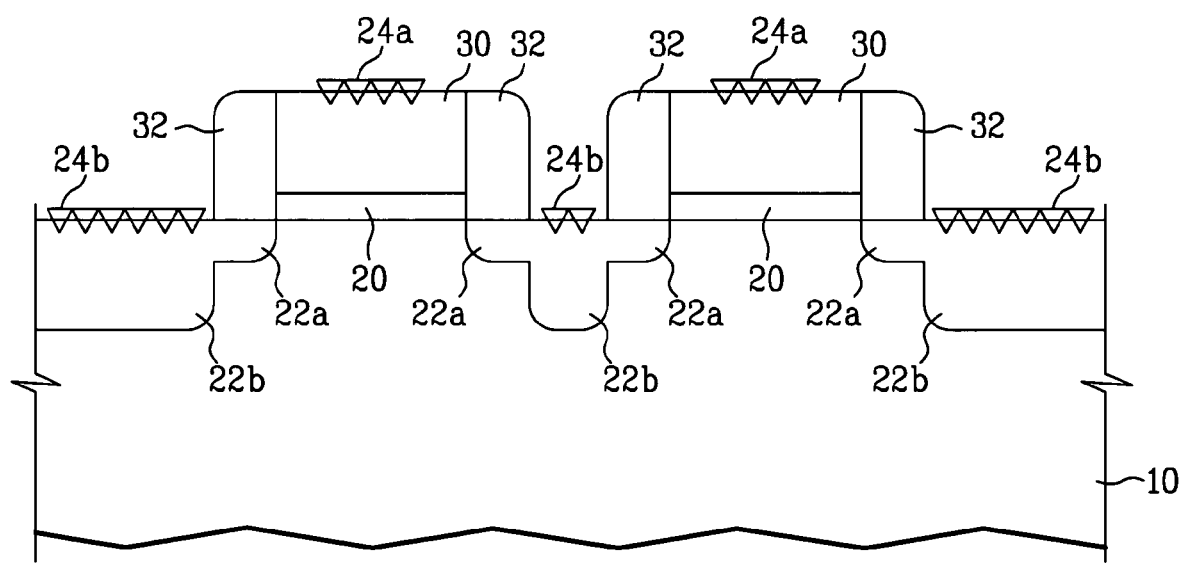
FIG. 2 is a schematic view illustrating a space shortage problem occurring when a salicide layer is formed in a source-drain area due to a narrow width of a gate and a narrow distance between gates in a conventional transistor manufacturing method.
Figure 3C:
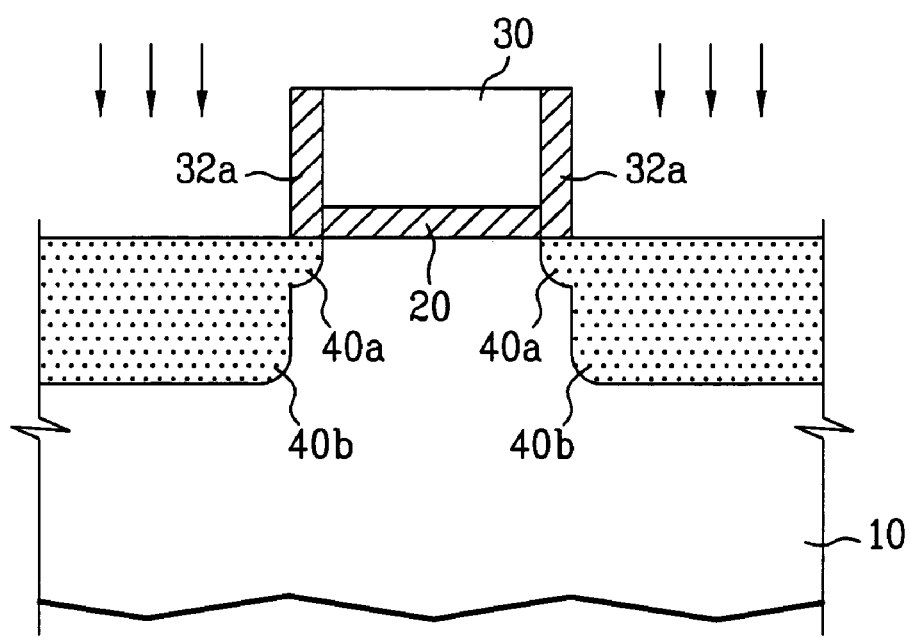

Next, as shown in FIG. 3C, a second LDD implant process in which the impurity ions are implanted and thermally annealed using the polysilicon gate 30 and the first spacer 32a as a mask. The second LDD implant process is performed by implanting the impurity ion having the same conductive type with respect to the aforementioned first LDD implant process with a low concentration, except that a second LDD area 40b is formed to have a sufficient depth in the second LDD implant process. Conventionally, when the LDD area is formed, as in FIG. 1B, the lateral diffusion has had to be considered to result in a shallowly formed LDD. However, according to the present invention, since the boundary of the lateral diffusion is determined in the first LDD implant process, the second LDD area 40b can be implemented to a sufficient depth.

Figure 3D:
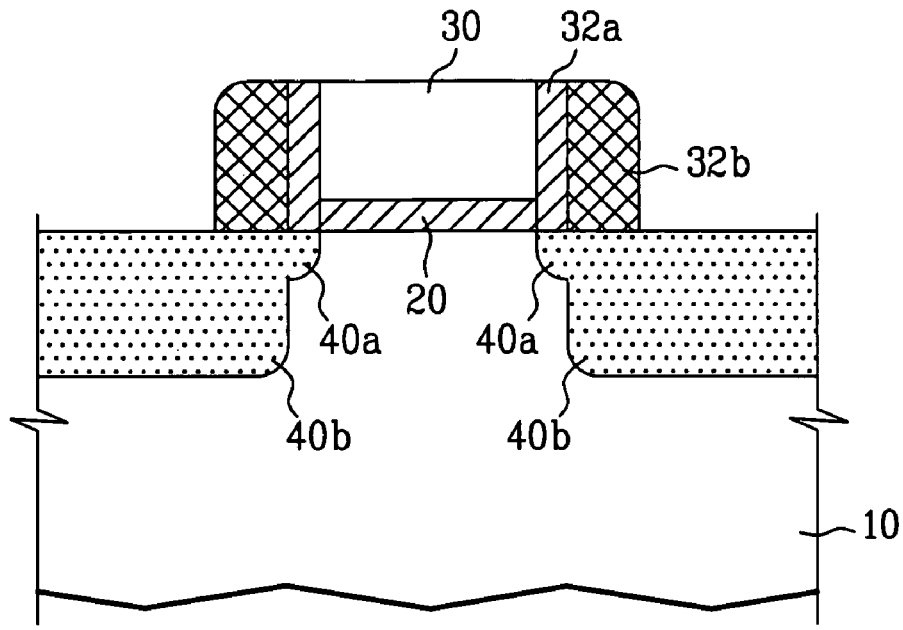
Figure 3E:
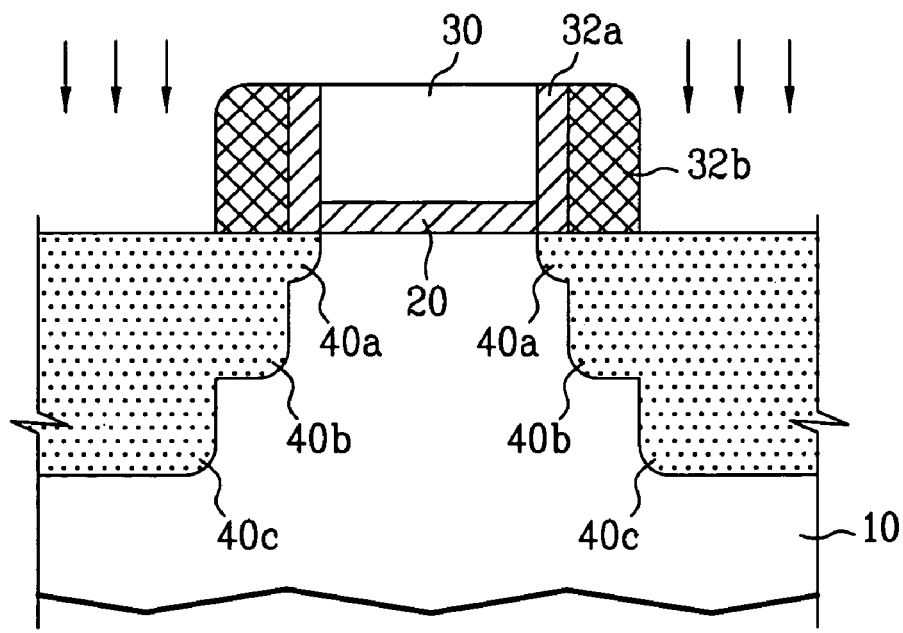

Next, after the first LDD area 40a and the second LDD area 40b are formed, a silicon nitride layer is deposited on the whole surface of the substrate 10, and then a second spacer 32b is formed on the both lateral walls of the gate 30 and the first spacer 32a in the photolithography and etching processes, as seen in FIG. 3D. The second spacer 32b functions as a mask when the source-drain diffusion area is formed in the ion implantation process. As shown in FIG. 3E, using the polysilicon gate 30, the first spacer 32a, and the second spacer 32b as a mask, the impurity ion is implanted and thermally annealed to form a source-drain diffusion area 40c with a high concentration.

Figure 3F:
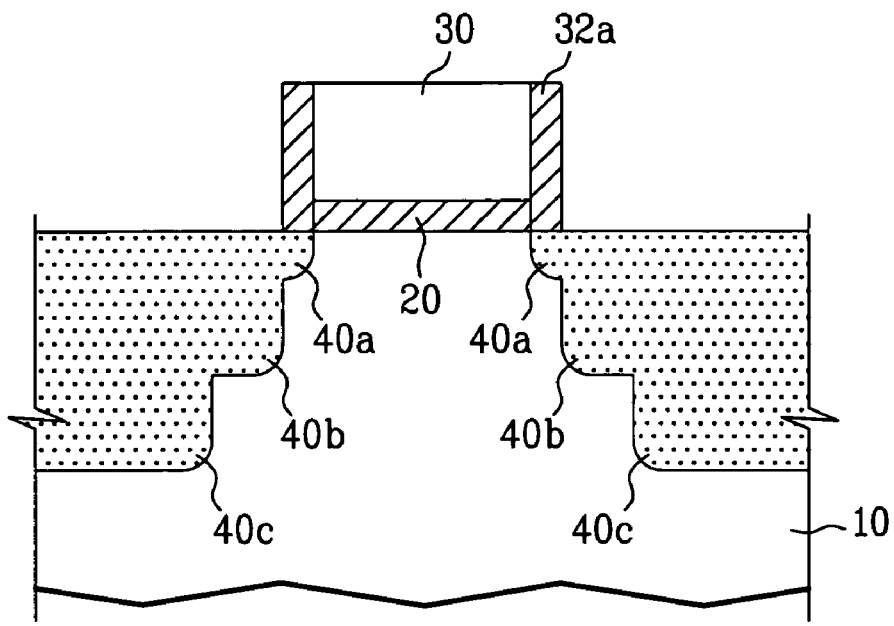

After the source-drain diffusion area 40c is formed, the second spacer 32b formed on the lateral walls of the gate 30 is removed by selective etching, as seen in FIG. 3F. This is to ensure a salicide forming area in the source-drain area, and any short between the gate and the source-drain diffusion area can be sufficiently controlled by the first spacer 32a.

Figure 3G:
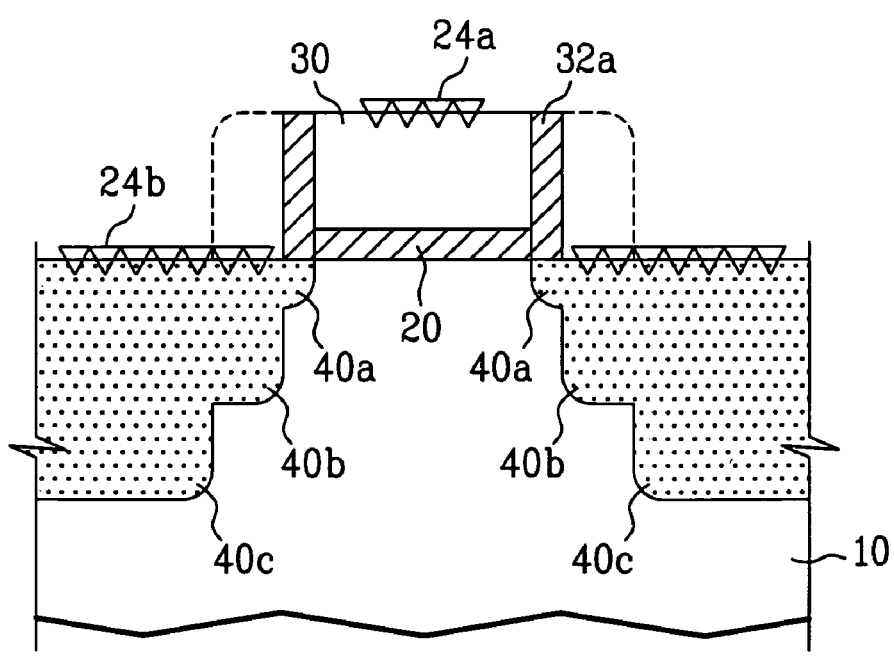

Next, as shown in FIG. 3G, a salicide forming metal such as cobalt (Co) or titanium (Ti) which forms the salicide in reaction with silicon or polysilicon is deposited on the whole surface of the substrate 10, and salicide layers 24a and 24b are formed on a polysilicon gate and on a silicon substrate of the source-drain diffusion area in an annealing process. Any metal which has not been reacted is removed by selective etching. An area occupied by the second spacer 32b is shown as a dotted line in the FIGs. As shown in FIG. 3G, the salicide forming area can be sufficiently provided in the source-drain area by removing the area occupied by the second spacer 32b. Thus, the resistance of the source-drain area can be reduced, thereby improving a transistor performance.

According to an exemplary embodiment of the present invention, a double LDD structure is formed in a MOS transistor such that a lateral diffusion of impurities towards the lower portion of a gate can be effectively prevented when an LDD is formed. An overlap of a gate area is formed by a first LDD implant, and an LDD extension with a high concentration can be implemented by a second LDD implant without the lateral diffusion of the impurities. Therefore, a saturation current increases in a source-drain area, a short channel effect is improved, a parasitic capacitor is reduced, and thus a transistor element which is a component of an integrated circuit can be rapidly scaled down.

In addition, according to a double LDD MOS transistor of the exemplary embodiment of the present invention, a first spacer which is relatively shallow and a second spacer which is formed to be relatively thick are used, and a free space for forming a salicide in a gate and a diffusion area between the gates can be sufficiently ensured by removing the second spacer which is formed later. A spacer formed on lateral walls of the gate is removed except for a minimum portion thereof, and as such, a gate electrode having a maximum width can be implemented regardless of the size of the transistor element, which leads to a more flexible design. In addition, a wider salicide forming area can be ensured at the gate and between the gates, such that a salicide layer can be stably formed in the source-drain area, thereby reducing a resistance and improving a transistor performance.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A manufacturing method of a double LDD MOS transistor comprising the steps of:
    forming a gate electrode on a semiconductor substrate;
    forming a first LDD area by implanting and thermally annealing impurity ions using the gate electrode as a mask;
    forming a first spacer on both lateral walls of the gate electrode;
    forming a second LDD area by implanting and thermally annealing impurity ions using the gate electrode and the first spacer as a mask;
    forming a second spacer on both lateral walls of the gate electrode and the first spacer;
    forming a source-drain diffusion area by implanting and thermally annealing impurity ions using the gate electrode, the first spacer, and the second spacer as a mask;
    opening the second LDD area located at the bottom of the second spacer by removing the second spacer by selective etching after the source-drain diffusion area is formed; and
    forming salicide layers on the gate electrode, the opened second LDD area, and the source-drain diffusion area, respectively, by forming and annealing a salicide forming metal on the semiconductor substrate.

2. The manufacturing method of a double LDD MOS transistor according to claim 1, wherein the first spacer is formed with a silicon oxide.

3. The manufacturing method of a double LDD MOS transistor according to claim 1, wherein the second spacer is formed with a nitride oxide.

4. A double LDD MOS transistor in which a first LDD area and a second LDD area are formed by a manufacturing method according to claim 1.

5. A double LDD MOS transistor in which a first LDD area and a second LDD area are formed by a manufacturing method according to claim 2.

6. A double LDD MOS transistor in which a first LDD area and a second LDD area are formed by a manufacturing method according to claim 3.

* * * * *